(12) United States Patent
Chen et al.

(10) Patent No.: US 12,284,851 B2
(45) Date of Patent: Apr. 22, 2025

(54) DISPLAY PANEL, METHOD FOR MANUFACTURING THE SAME, AND DISPLAY APPARATUS

(71) Applicants: BOE MLED Technology Co., Ltd., Beijing (CN); BOE TECHNOLOGY GROUP CO., LTD., Beijing (CN)

(72) Inventors: Yinwei Chen, Beijing (CN); Haiwei Sun, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 542 days.

(21) Appl. No.: 17/789,593

(22) PCT Filed: May 28, 2021

(86) PCT No.: PCT/CN2021/096863
§ 371 (c)(1),
(2) Date: Jun. 28, 2022

(87) PCT Pub. No.: WO2021/239124
PCT Pub. Date: Dec. 2, 2021

(65) Prior Publication Data
US 2023/0048591 A1 Feb. 16, 2023

(30) Foreign Application Priority Data
May 29, 2020 (CN) .......................... 202010479612.9

(51) Int. Cl.
*H10H 20/855* (2025.01)
*H01L 25/075* (2006.01)
*H10H 20/01* (2025.01)

(52) U.S. Cl.
CPC ....... *H10H 20/855* (2025.01); *H01L 25/0753* (2013.01); *H10H 20/0363* (2025.01)

(58) Field of Classification Search
None
See application file for complete search history.

(56) References Cited

U.S. PATENT DOCUMENTS

| 10,133,347 B2 * | 11/2018 | Qin .................... G02B 27/0179 |
| 2006/0001974 A1 * | 1/2006 | Uehara ................. G02B 30/27 359/619 |

(Continued)

FOREIGN PATENT DOCUMENTS

| CN | 1734311 A | 2/2006 |
| CN | 102456816 A | 5/2012 |

(Continued)

OTHER PUBLICATIONS

CN 105742307, Zhang et al, A Colour Micro-display Device and preparation Method, Jul. 6, 2016 (Year: 2016).*

*Primary Examiner* — Alexander G Ghyka
(74) *Attorney, Agent, or Firm* — XSENSUS LLP

(57) ABSTRACT

A display panel includes a display module and a lens layer. The display module has a display region and includes a plurality of pixel units disposed in the display region and distributed in an array, each pixel unit is configured to emit light. The lens layer is disposed on a display side of the display module. Light emitted by the plurality pixel units passes through the lens layer to form a display image, and the display image includes a plurality of pixels distributed in an array. The number of pixel units included in a row of pixel units in a first direction is less than the number of pixels included in a row of pixels in the first direction. A first pixel distance is smaller than a first pixel unit distance.

20 Claims, 7 Drawing Sheets

(56) References Cited

U.S. PATENT DOCUMENTS

| | | | |
|---|---|---|---|
| 2008/0218867 A1 | 9/2008 | Uehara et al. | |
| 2013/0128351 A1 | 5/2013 | Gollier et al. | |
| 2014/0028933 A1* | 1/2014 | Chen | G02B 30/26 |
| | | | 359/465 |
| 2014/0071313 A1* | 3/2014 | Hiasa | H04N 5/21 |
| | | | 348/231.99 |
| 2015/0301342 A1 | 10/2015 | Johnson et al. | |
| 2019/0045176 A1* | 2/2019 | Ratcliff | G02B 30/36 |
| 2019/0369407 A1* | 12/2019 | Kim | G02B 30/27 |
| 2021/0134844 A1 | 5/2021 | Liu | |

FOREIGN PATENT DOCUMENTS

| | | |
|---|---|---|
| CN | 103748874 A | 4/2014 |
| CN | 105742307 A | 7/2016 |
| CN | 107561723 A | 1/2018 |
| CN | 111599835 A | 8/2020 |

* cited by examiner (a)

(b)

(c)

(d)

DISPLAY PANEL, METHOD FOR MANUFACTURING THE SAME, AND DISPLAY APPARATUS

CROSS-REFERENCE TO RELATED APPLICATIONS

This application is a national phase entry under 35 USC 371 of International Patent Application No. PCT/CN2021/096863, filed on May 28, 2021, which claims priority to Chinese Patent Application No. 202010479612.9, filed on May 29, 2020, which are incorporated herein by reference in their entirety.

TECHNICAL FIELD

The present disclosure relates to the field of display technologies, and in to particular, to a display panel and a method for manufacturing the same, and a display apparatus.

BACKGROUND

There are various types of display apparatuses, which may be classified into liquid crystal display (LCD) apparatuses, inorganic electroluminescent display (ELD) apparatuses, organic light-emitting diode (OLED) display apparatuses, field emission display (FED) apparatuses and the like according to display media and operation principles. Display apparatuses of various types may be applied to a variety of scenarios to meet different image display requirements.

SUMMARY

In an aspect, a display panel is provided. The display panel includes a display module and a lens layer. The display module has a display region, and the display module includes a plurality of pixel units disposed in the display region and distributed in an array, and each pixel unit is configured to emit light. The lens layer is disposed on a display side of the display module. Light emitted by the plurality of pixel units passes through the lens layer to form a display image, and the display image includes a plurality of pixels distributed in another array. A number of pixel units included in a line of pixel units in a first direction is less than a number of pixels included in a line of pixels in the first direction. A first pixel distance is less than a first pixel unit distance. The first pixel distance is a distance between every two adjacent pixels in the first direction, and the first pixel unit distance is a distance between every two adjacent pixel units in the first direction. The first direction is one of a row direction and a column direction of the plurality of pixel units distributed in the array.

In some embodiments, a number of pixel units included in a line of pixel units in a second direction is less than a number of pixels included in a line of pixels in the second direction, and a second pixel distance is less than a second pixel unit distance. The second pixel distance is a distance between every two adjacent pixels in the second direction, and the second pixel unit distance is a distance between every two adjacent pixel units in the second direction. The second direction is perpendicular to the first direction.

In some embodiments, a size of the display region is substantially equal to a size of the display image.

In some embodiments, the lens layer includes a plurality of convex lenses distributed in an array, and optical centers of the plurality of convex lenses are in a same plane. A focal length f of each convex lens and T satisfy a following condition: T is greater than a product of 2 and f (T>2×f), wherein T is a set distance, and the set distance is a vertical distance between a light-exit surface of each pixel unit and the plane where the optical centers of the plurality of convex lenses are located.

In some embodiments, any two adjacent convex lenses are in contact with each other.

In some embodiments, each convex lens is arched in a direction of the convex lens away from the display module.

In some embodiments, T is greater than or equal to C, and is less than or equal to a product of 4 and C (C≤T≤4×C), wherein C is a reference distance, the reference distance is a greater one of the first pixel unit distance and a second pixel unit distance. The second pixel unit distance is a distance between every two adjacent pixel units in a second direction, and the second direction is perpendicular to the first direction.

In some embodiments, L1 is greater than or equal to a product of 0.7 and D1, and is less than or equal to a product of 2 and D1 (0.7×D1≤L1≤2×D1), wherein D1 is the first pixel unit distance, and L1 is a first lens distance. The first lens distance is a distance between optical centers of two adjacent convex lenses in the lens layer in the first direction.

In some embodiments, L2 is greater than or equal to a product of 0.7 and D2, and is less than or equal to a product of 2 and D2 (0.7×D2≤L2≤2×D2), wherein D2 is a second pixel unit distance, and L2 is a second lens distance. The second lens distance is a distance between optical centers of two adjacent convex lenses in the lens layer in a second direction, the second pixel unit distance is a distance between every two adjacent pixel units in the second direction, and the second direction is perpendicular to the first direction.

In some embodiments, a distance between optical centers of every two adjacent convex lenses is in a range from 0.1 mm to 10 mm, inclusive, and a height by which each convex lens arches is in a range from 0.1 mm to 0.5 mm, inclusive.

In some embodiments, an orthogonal projection of each convex lens on the display module has a rectangular shape, a triangular shape or a polygonal shape.

In some embodiments, a surface of the lens layer away from the display module is a rough surface.

In some embodiments, the lens layer further includes a transparent substrate in direct contact with surfaces of the plurality of convex lenses proximate to the display module.

In some embodiments, a material of the transparent substrate is different from a material of the convex lenses.

In some embodiments, each pixel unit includes at least one light-emitting device. The display module further includes a substrate, and light-emitting devices in the plurality of pixel units are disposed on the substrate. The display module further includes a transparent material layer covering the light-emitting devices, and a distance between a surface of the transparent material away from the light-emitting devices and the substrate is greater than distances between light-exit surfaces of the light-emitting devices and the substrate.

In some embodiments, the light-emitting device is a light-emitting diode.

In another aspect, a display apparatus is provided. The display apparatus includes the display panel according to any of the above embodiments.

In yet another aspect, a method for manufacturing a display panel is provided. The method includes: forming a display module, the display module having a display region and including a plurality of pixel units disposed in the display region and distributed in an array, each pixel unit being configured to emit light; and forming a lens layer on a display side of the display module. Light emitted by the plurality of pixel units passes through the lens layer to form a display image, and the display image includes a plurality of pixels distributed in another array. A number of pixel units included in a line of pixel units in a first direction is less than a number of pixels included in a line of pixels in the first direction. A first pixel distance is less than a first pixel unit distance, the first pixel distance is a distance between every two adjacent pixels in the first direction, and the first pixel unit distance is a distance between every two adjacent pixel units in the first direction. The first direction is one of a row direction and a column direction of the plurality of pixel units distributed in the array.

In some embodiments, forming the display module includes: forming a plurality of light-emitting devices on a substrate; and forming a transparent material layer covering the plurality of light-emitting devices on the substrate. A distance between a surface of the transparent material layer away from the plurality of light-emitting devices and the substrate is greater than distances between light-exit surfaces of the plurality of light-emitting devices and the substrate.

In some embodiments, forming the lens layer on the display side of the display module includes: forming a transparent film on a transparent substrate; imprinting the transparent film by a mold imprinting process to form the lens layer; and adhering the lens layer to the display module. A surface of a mold core of a mold used in the mold imprinting process is a rough surface.

BRIEF DESCRIPTION OF THE DRAWINGS

In order to describe technical solutions in embodiments of the present disclosure or in the related art more clearly, accompanying drawings to be used in the embodiments or in the related art will be introduced briefly below. Obviously, the accompanying drawings to be described below are merely accompanying drawings of some embodiments of the present disclosure, and a person of ordinary skill in the art may obtain other drawings according to these drawings without creative efforts.

DETAILED DESCRIPTION

Figure 1:
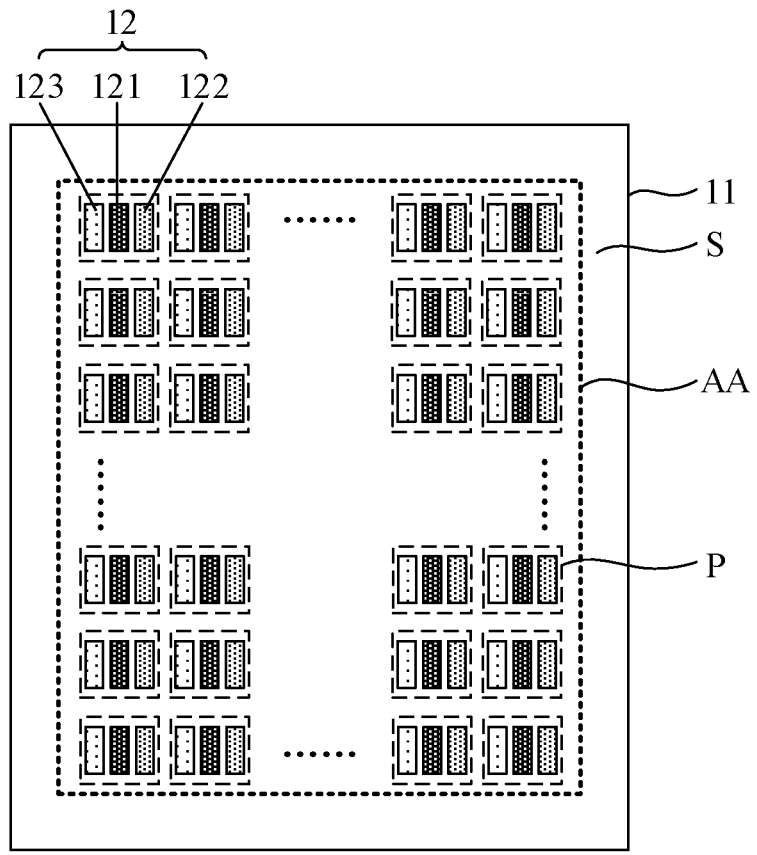
FIG. 1 is a structural diagram of a display module, in accordance with embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined by "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed here are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The usage of the phrase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

As used herein, the term such as "about", "substantially" or "approximately" includes a stated value and an average value within an acceptable range of deviation of a particular value. The acceptable range of deviation is determined by a person of ordinary skill in the art, in view of the measurement in question and errors associated with the measurement of a particular quantity (i.e., the limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in an apparatus, and are not intended to limit the scope of the exemplary embodiments.

A display apparatus, for example, includes a plurality of light-emitting devices, and employs a driving circuit (e.g., a pixel driving circuit) to control brightness of a light-emitting device in each pixel unit, so as to display a corresponding image. A light-emitting diode (LED) is a type of semiconductor diode, and is a photoelectric element that emits light relying on unidirectional conductivity of a semiconductor PN junction. The light-emitting diode has advantages such as small volume, high brightness, low power consumption, low heat generation, long service life and environmental protection, and is deeply loved by consumers as a widely used light-emitting device. At present, a price of a LED display apparatus sold in the market is mainly determined by a distance between LEDs in the display apparatus. The smaller the distance, the finer an image displayed by the display apparatus, the better a display effect, and the higher the price. However, since the LED is a direct current (DC) light-emitting device, there needs to be a certain interval to provide a driving circuit with a certain width, which makes it difficult in process to further reduce the distance between the LEDs, and limits the reduction of the distance. As a result, the LEDs are arranged at a relatively low density, and a distinct granular sense of the image displayed by the display apparatus may be produced visually, which reduces viewing experience.

In order to solve this problem, some embodiments of the present disclosure provide a display apparatus. For example, the display apparatus may be any one of a display, a television, a billboard, a laser printer with a display function, a home appliance, a large-area wall, an information inquiry device (e.g., an inquiry device for business in a department such as an electronic government (E-government), a bank, a hospital or a power department), a mobile phone, a personal digital assistant (PDA), a digital camera, a portable camcorder, a navigator, or the like. The display apparatus may also be a microdisplay or a product including a microdisplay, such as a near-eye display or a wearable device, which may be an augmented reality (AR) or virtual reality (VR) system, smart glasses, a head mounted display (abbreviated as HMD), or a head up display (abbreviated as HUD).

Figure 2:
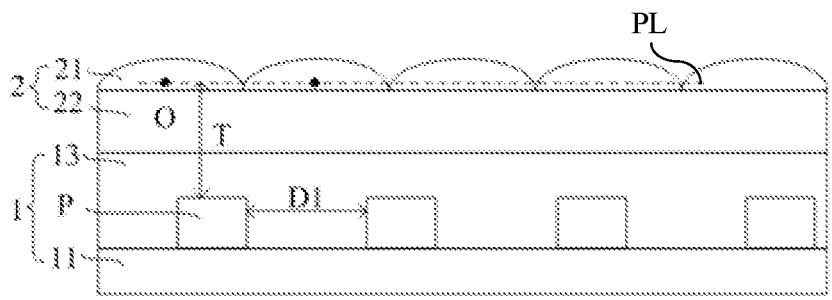
FIG. 2 is sectional view of a display panel, in accordance with embodiments of the present disclosure.

In some embodiments of the present disclosure, as shown in FIG. 2, the display apparatus 01 includes a display panel 10. For example, the display panel may be an organic light-emitting diode (OLED) panel, a quantum dot light-emitting diode (QLED) panel, a liquid crystal display (LCD) panel, a tiny LED (including a mini LED or a micro LED) panel.

For example, a structure of the display panel will be described by considering an example in which the display apparatus includes the mini LED display panel.

Referring to FIG. 1, the display panel 10 includes a display module 1. The display module 1 has a display region AA and a peripheral region S. The peripheral region S is located on at least one side of the display region AA. For example, the peripheral region S may be disposed around the display region AA. The display region AA is provided with a plurality of pixel units P distributed in an array, and each pixel unit P is configured to emit light.

As shown in FIG. 1, the display module 1 may further include a substrate 11. Light-emitting devices 12 in the plurality of pixel units P are disposed on the substrate 11, and there is a distance between any two adjacent light-emitting devices 12. A light-emitting device may be an LED, a mini LED or a micro LED. For example, in a case where the display panel is the mini LED display panel, the light-emitting device 12 is the mini LED, i.e., a LED, between the LED and the micro LED, with a size on an order of 100 microns, which is a result of further reduction of a size of the LED.

For example, as shown in FIG. 1, each pixel unit P may include sub-pixels of three emission colors (e.g., three primary colors). For example, each sub-pixel may include a light-emitting device 12. For example, the pixel unit P may include a first light-emitting diode 121 that emits red light, a second light-emitting diode 122 that emits green light, and a third light-emitting diode 123 that emits blue light. A sum of the light emitted by the three light-emitting diodes is light emitted by the pixel unit P. The first light-emitting diode 121, the second light-emitting diode 122 and the third light-emitting diode 123 may have a same size or different sizes. The embodiments of the present disclosure are described by considering an example in which they have the same size. These light-emitting devices 12, after being encapsulated, are fixed on the substrate 11 by means of surface mounting, and are coupled to driving circuits disposed on the substrate 11, so that the driving circuits each drive a respective light-emitting device 12 to achieve image display.

Based on this, in some embodiments, as shown in FIG. 2, the display panel further includes a lens layer 2 disposed on a display side of the display module 1. The display side of the display module 1 is a side from which the light emitted by the pixel unit exits (i.e., an upper side in FIG. 2). That is to say, the lens layer 2 is located on a side of the light-emitting devices 12 away from the substrate 11. In addition, the lens layer 2 may be disposed on the substrate 11. For example, the lens layer 2 may be fixed on the substrate 11. In this way, a relative displacement between the lens layer 2 and the display module 1 may be avoided, thereby ensuring an image quality.

The lens layer 2 may include a single lens or a plurality of lenses. A lens is an optical element made of a transparent substance, which may be, for example, an optical plastic (e.g., polycarbonate (PC), polymethyl methacrylate (PMMA), or an ultraviolet (UV) ray curing adhesive). The lens is a refractive lens, refracting surface(s) of which are curved surface(s) with a certain curvature radius. For example, the refracting surface of the lens may include two curved surfaces, each of which is a part of a spherical surface. For another example, the refracting surfaces of the lens may have a complex aspherical shape. For yet another example, the refracting surfaces of the lens may include a flat surface and a curved surface, and the curved surface is a part of a spherical surface. The lens may produce a real image or a virtual image. Lenses may be classified into convex lenses and concave lenses according to shapes thereof. A lens with a thick center and a thin edge is a convex lens. Convex lenses may be classified into biconvex lenses (lenses with two convex surfaces), plano-convex lenses (lenses with one convex surface and one flat surface), and concave-convex lenses (lenses with one concave surface and one convex surface). A lens with a thin center and a thick edge is a concave lens. Concave lenses may be classified into biconcave lenses (lenses with two concave surfaces), plano-concave lenses (lenses with one concave surface and one flat surface), and convex-concave lenses (lenses with one convex surface and one concave surface).

For example, light emitted by the plurality of pixel units passes through the lens layer to form a display image, which includes a plurality of pixels distributed in an array. For example, after providing the lens layer 2 on the display side of the display module 1, a simulation is performed by using an optical simulation software, so as to obtain the display image 100 in a local region shown in FIG. 3 formed by the lens layer 2 and an initial image in a local region shown in FIG. 4 directly presented by pixel units P. An area of the local region of the display image is equal to an area of the local region of the initial image. It can be seen that, the light emitted by each pixel unit P, after being refracted by the lens layer 2, exits from a surface of the lens layer 2 away from the display module 1, and then is recombined to form the display image on a side of the lens layer 2 away from the display module 1. Similar to the display module 1 having the plurality of pixel units P distributed in the array, the display image also has a plurality of pixels P' distributed in the array, and each pixel P' may include imaging points of three emission colors, which are images produced by light emitted by the light-emitting devices 12 of three colors after passing through the lens layer 2, and the images may be, for example, real images.

Figure 3:
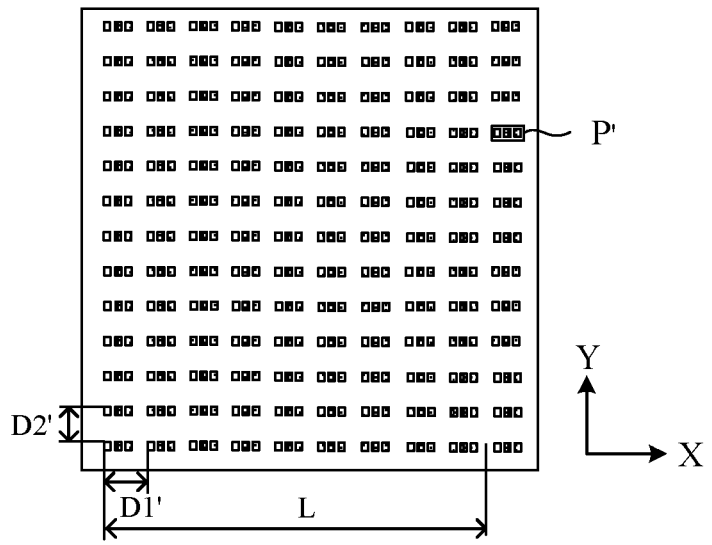
FIG. 3 is a schematic diagram of a display image in a local region, in accordance with embodiments of the present disclosure.
Figure 4:
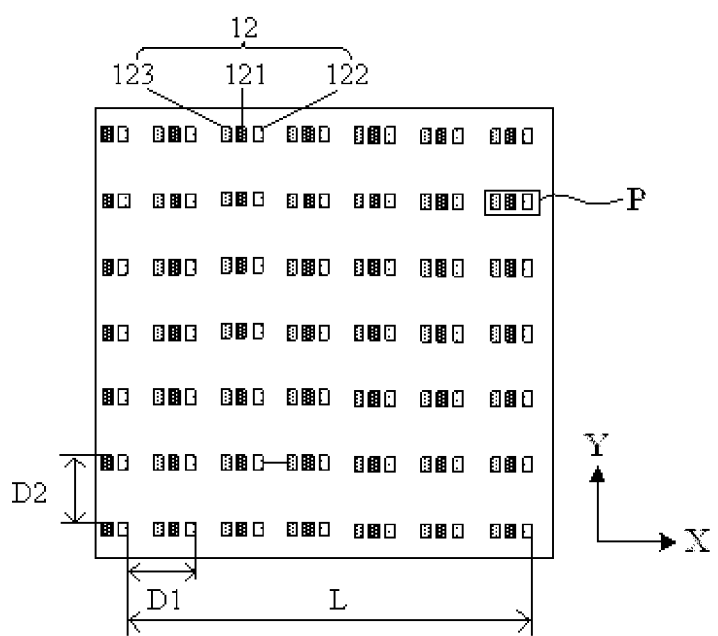
FIG. 4 is a schematic diagram of an initial image in a local region, in accordance with embodiments of the present disclosure.

With continued reference to FIGS. 3 and 4, the number of pixel units P included in a line of pixel units P in a first direction is less than the number of pixels P' included in a line of pixels P' in the first direction, and a first pixel distance D1' is less than a first pixel unit distance D1. The first pixel distance D1' is a distance between every two adjacent pixels P' in the first direction, and the first pixel unit distance D1 is a distance between every two adjacent pixel units P in the first direction. The first direction is a row direction or a column direction of the plurality of pixel units P distributed in the array. A pixel distance (e.g., the first pixel unit distance D1 or the first pixel distance D1') is a smallest length of a pixel repeating unit. In a case where the display panel is the LCD display panel, the first pixel unit distance D1 may also be referred to as a pixel pitch. In a case where the display panel is the LED display panel, the first pixel unit distance D1 may also be referred to as a pixel pitch. The definition of the first pixel distance D1' is similar to that of the first pixel unit distance D1, and will not be repeated here. The first direction may be the row direction (i.e., an X direction) or the column direction (i.e., a Y direction), which is not limited too much. For clarity of description, the embodiments of the present disclosure will be described below by considering an example in which the first direction is the row direction.

The area of the local region of the display image is equal to the area of the local region of the initial image. It can be seen from FIGS. 3 and 4 that, in the initial image, there are approximately 6.5 pixel units P in the X direction, then there are 6 first pixel unit distances D1 in the X direction, and a size of the pixel unit P is relatively large, and in this case, 6×D1=L, where L is a fixed length; and in the display image, there are 10 pixels P' in the X direction, then there are 9 first pixel distances D1' in the X direction, and a size of the pixel P' is relatively small, and in this case, 8.4×D1'=L.

It can be seen therefrom that, due to an optical effect of the lens layer 2, the to display image formed by the light emitted by the plurality of pixel units P after passing through the lens layer 2 is equivalent to a reduced real image that is produced by the initial image directly generated by the plurality of pixel units P in the first direction. An imaging position of the display image may be located between a user and the lens layer 2, and a display frame that the user actually views when using the display panel is the display image. In the first direction, the size of each pixel P' in the display image is less than the size of any pixel unit P, and the first pixel distances D1' are all less than the first pixel unit distances D1. In a unit area, the number of first pixel distances D1' and the number of pixels P' are respectively greater than the number of first pixel unit distances D1 and the number of pixel units P. That is, in the unit area, the number (a density) of the pixels P' is greater than the number (a density) of the pixel units P. In addition, it can also be seen that, after optical transformation of the lens layer 2, an arrangement direction of images produced by the first light-emitting diode 121, the second light-emitting diode 122 and the third light-emitting diode 123 is rotated by 180°. For example, in the initial image, a sequence of emission colors of the light emitted by the light-emitting devices in each pixel unit P in the X direction is red, green and blue, whereas in the display image, a sequence of colors in each pixel P' in the X direction is blue, green and red. It indicates that the image produced by the lens layer 2 is an inverted reduced real image.

It can be seen from the above that, by providing the lens layer 2, the initial image directly formed by the pixel units P may form the display image due to the optical effect of the lens layer 2, and in the first direction, the first pixel distance D1' in the display image is less than the first pixel unit distance D1. That is, by providing the lens layer 2, the display image with a small distance between the pixels P' in the first direction may be formed, without reducing the first pixel unit distance D1 of the display module 1 at a process level, and without increasing the arrangement density of the light-emitting devices 12 (i.e., the pixel units P). As a result, fineness of the image displayed by the display apparatus may be improved, and a good display effect may be achieved. In addition, it is possible to facilitate cost control and optimization while commercial value of the product is improved.

The number of layers of the lenses in the lens layer 2, and type(s) (e.g., the convex lenses or the concave lenses) and the number of lenses in each layer are not limited. The lens layer 2 may include only convex lenses, or may include only concave lenses, or may include both convex lenses and concave lenses, as long as the display image formed by the light emitted by the plurality of pixel units P after passing through the lens layer 2 may achieve the above effects.

For example, with continued reference to FIGS. 3 and 4, the number of pixel units P included in a line of pixel units P in a second direction is less than the number of pixels P' included in a line of pixels P' in the second direction, and a second pixel distance D2' is less than a second pixel unit distance D2. The second pixel distance D2' is a distance between every two adjacent pixels P' in the second direction, and the second pixel unit distance D2 is a distance between every two adjacent pixel units P in the second direction. The second direction is perpendicular to the first direction. As described above, the first direction is the row direction, and then the second direction is the column direction. For example, in the Y direction, a size of the pixel P' is less than a size of the pixel unit P in the initial image. In the unit area, the number of pixels P' and the number of second pixel distances D2' are respectively greater than the number of pixel units P and the number of second pixel unit distances D2. The second pixel distances D2' are all less than the second pixel unit distances D2. That is, due to the optical effect of the lens layer 2, the initial image generated by the plurality of pixel units P as a whole produces a reduced real image, which is the display image. In combination with the above, the pixel distances in the first direction and second direction are both reduced. As a result, the fineness of the image displayed by the display apparatus may be further improved, and the display effect may be better.

For example, a size of the display region is substantially equal to a size of the display image. The size here refers to a size expressed in units of length, rather than the size expressed in units of pixels. The size of the display region is a size of a display screen of the display apparatus, i.e., a size of the initial image formed by the display module. For example, the size of the display region may be 20 inches (40.64 cm long, and 30.48 cm wide), 22 inches (44.7 cm long, and 33.53 cm wide), 29 inches (58.93 cm long, and 44.2 cm wide), or the like. The size of the display image is the length and the width of the display image. The size of the display region being substantially equal to the size of the display image means that, a ratio of an absolute value of a difference between the size of the display region and the size of the display image to the size of the display region is not greater than 5%, and may be, for example, 2% or less. For example, the size of the display region is 44.7 cm long and 33.53 cm wide. Since the size of the display region is equal to the size of the display image, the size of the display image is also 44.7 cm long and 33.53 cm wide. In combination with the above, due to the optical effect of the lens layer 2, the lens layer 2 refracts and rearranges the light emitted by the plurality of pixel units P, so that a resolution of the formed display image is greater than a resolution of the display module, and the density of the pixels P' in the display image is greater than the density of the pixel units P in the display module 1. The plurality of pixels P' in the display image are not in one-to-one correspondence with the plurality of pixel units P in the display module 1. Some pixels P' in the display image are new pixels P' formed after light emitted by some pixel units P in the display module is refracted and rearranged, and the number of the pixels P' in the display image is greater than the number of the pixel units P in the display module. As a result, it is possible to achieve the effects of reducing the distance and increasing the fineness of the display image.

Figure 5:
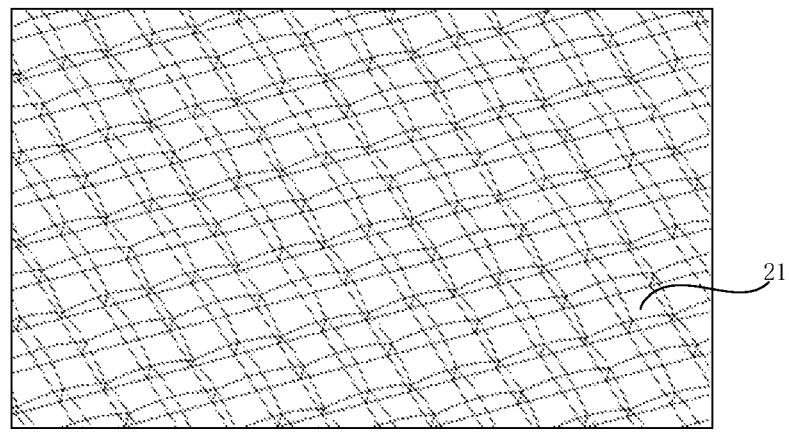
FIG. 5 is a structural diagram of an arrangement of a lens array, in accordance with embodiments of the present disclosure.

For example, as shown in FIG. 2, the lens layer 2 includes a plurality of convex lenses 21 distributed in an array, and optical centers O of the plurality of convex lenses 21 are in a same plane PL. Any two adjacent convex lenses 21 may be in contact with each other, and each convex lens 21 is arched in a direction of the convex lens 21 away from the display module 1. Referring to FIGS. 2 and 5, the plurality of convex lenses 21 included in the lens layer 2 are all plano-convex lenses, and the plurality of convex lenses 21 have a same shape. In this case, the positions of the optical centers O of the plurality of convex lenses 21 are the same in their respective convex lenses 21. Since light-exit surfaces of the plurality of pixel units P in the display module are in a same plane, in order to make distances between the plurality of pixel units P and the lens layer 2 all equal, the optical centers O of the convex lenses in the lens layer 2 are also in the same plane, which may ensure that the lens layer 2 has a same optical effect on each pixel unit P, and reduce factors that may adversely affect the display effect. A longitudinal section of each convex lens 21 may have a shape of a fan, a semicircle (i.e., a part of a circle, which may be a half or less than a half of the circle), a semiellipse (i.e., a part of an ellipse, which may be a half or less than a half of the ellipse), or a parabola (i.e., an axisymmetric figure enclosed by a parabola and a straight line segment). Each convex lens 21 is arched in the direction of the convex lens 21 away from the display module 1, and a surface of the lens layer 2 proximate to the display module is a flat surface. In this way, it is possible to prevent the convex lenses 21 from arching in a direction proximate to the display module 1, which may cause an uneven thickness of a layer that is in direct contact with the lens layer 2 due to plurality of concaves matched with the convex lenses 21 being formed in the layer, and in turn cause generation of factors that may adversely affect the display effect. For example, referring to FIG. 5, two adjacent convex lenses 21 should be closely arranged (i.e., there being no distance between the two adjacent convex lenses 21, and edges thereof overlapping each other). However, limited by the existing process level, there may be a certain distance between two adjacent convex lenses. During actual fabrication, the distance between the convex lenses 21 should be reduced as much as possible in a case of allowance of process conditions.

Figure 6:
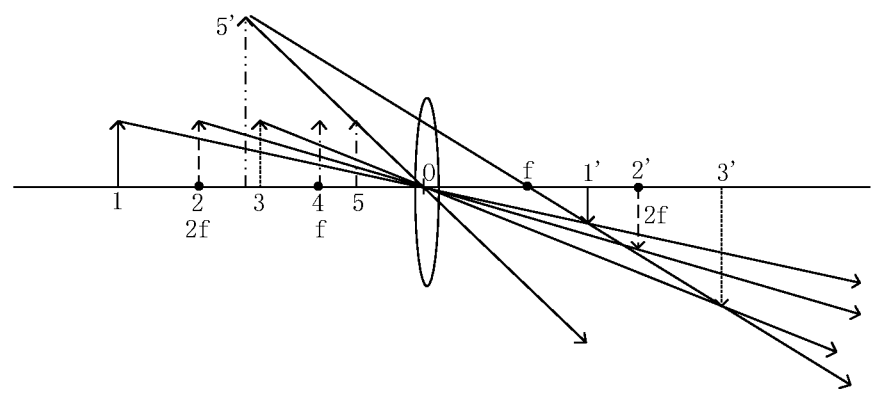
FIG. 6 is a diagram showing an imaging law of a convex lens, in accordance with embodiments of the present disclosure.

A focal length f of each convex lens 21 and a set distance T satisfy the following condition: the set distance T is greater than a product of 2 and f (T>2×f). Referring to FIG. 2, the set distance T is a vertical distance between a light-exit surface of each pixel unit P and the plane where the optical centers O of the plurality of convex lenses are located. For the convex lens, an imaging law thereof is shown in FIG. 6 and Table 1 below.

TABLE 1

| Serial number | Positions of object distance u and focal length f | Properties of image | Positions of image distance v and focal length f |
|---|---|---|---|
| 1 | u > 2f | Inverted, reduced, real image | 2f > v > f |
| 2 | u = 2f | Inverted, equal-sized, real image | v = 2f |
| 3 | 2f > u > f | Inverted, enlarged, real image | v > 2f |
| 4 | u = f | no image | / |
| 5 | f > u | upright, enlarged, virtual image | / |

According to the imaging law of the convex lens, and by setting parameters of each convex lens 21 (e.g., a curvature radius, a focal length and a refractive index of the lens) in the lens layer 2, and a distance between each convex lens 21 and a pixel unit P, the light emitted by the pixel units P in the display module 1 may form a display image after passing through the lens layer 2. Upon determining the shape of the convex lens 21, the focal length f of the convex lens 21 may be determined. In this case, in order to satisfy that the distance between each pixels P' and a respective adjacent pixel is reduced relative to that in the initial image, the object distance u and the focal length f need to satisfy the following relationship: u is greater than the product of 2 and f (u>2f). In the embodiments of the present disclosure, the vertical distance between the light-exit surface of each pixel unit P and the plane where the optical centers O of the convex lenses are located is the object distance u. That is, the set distance T is the object distance u. Therefore, referring to FIG. 2, in a case where the set distance T is greater than the product of 2 and f (T>2f), the plurality of pixel units P in the display module 1 and the distances therebetween both produce reduced images through the lens layer 2. As a result, as compared to the density of the pixel units in the initial image directly formed by the plurality of pixel units P in the display module 1, in the display image, the density of the pixels P' is greater, and the distances between the pixels are smaller, and the display image is finer and has a higher image quality, which facilitates to achieve a better display effect.

For example, T is greater than or equal to C, and is less than or equal to a product of 4 and C (C≤T≤4×C), where C is a reference distance. The reference distance is a greater one of the first pixel unit distance and the second pixel unit distance. It can be understood that, the first pixel unit distance D1 and the second pixel unit distance D2 may be equal or unequal. In a case where the first pixel unit distance D1 and the second pixel unit distance D2 are equal, the reference distance C is equal to the first pixel unit distance D1, and is also equal to the second pixel unit distance D2, and the first pixel unit distance D1 and the second pixel unit distance D2 both satisfy the above relationship. In a case where the first pixel unit distance D1 and the second pixel unit distance D2 are unequal, if the first pixel unit distance D1 is greater than the second pixel unit distance D2, the reference distance C is equal to the first pixel unit distance D1, and the set distance is greater than or equal to the first pixel unit distance D1, and is less than or equal to a product of 4 and the first pixel unit distance D1; conversely, the set distance is greater than or equal to the second pixel unit distance D2, and is less than or equal to a product of 4 and the second pixel unit distance D2. On a premise of satisfying the imaging law of the convex lens, limiting the distance between two adjacent pixel units to satisfy the above relationship is an optimized design for the related structure of the display panel disclosed by the embodiments of the present disclosure. This design may make the object distance in accordance with the imaging law more suitable for the structure of the display panel in the embodiments of the present disclosure, thereby facilitating to further improve the fineness of the display image and achieve a better display effect. Moreover, this arrangement may make the correspondence relationship between the plurality of convex lenses in the lens layer and the pixel units more reasonable, thereby preventing distortion of the display image obtained by imaging through the lens layer.

Figure 7:
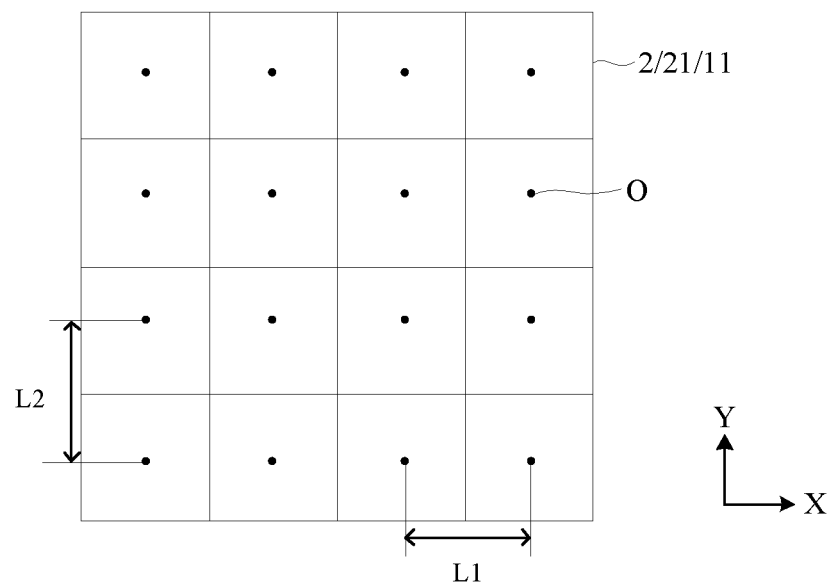
FIG. 7 is a structural diagram of another arrangement of a lens array, in accordance with embodiments of the present disclosure.

For example, referring to FIG. 7, L1 is greater than or equal to a product of 0.7 and D1, and is less than or equal to a product of 2 and D1 (0.7×D1≤L1≤2×D1), where D1 is the first pixel unit distance, L1 is a first lens distance. The first lens distance L1 is a distance between optical centers O of two adjacent convex lenses in the lens layer 2 in the first direction. Similarly, L2 is greater than or equal to a product of 0.7 and D2, and is less than or equal to a product of 2 and D2 (0.7×D2≤L2≤2×D2), where L2 is a second lens distance. The second lens distance L2 is a distance between optical centers O of two adjacent convex lenses in the lens layer 2 in the second direction. Similar to the above, the limiting relationship is also an optimized design for the related structure of the display panel disclosed by the embodiments of the present disclosure. Related arrangement and beneficial effects that may be achieved are similar to the above, and details will not be repeated here.

Figure 8:
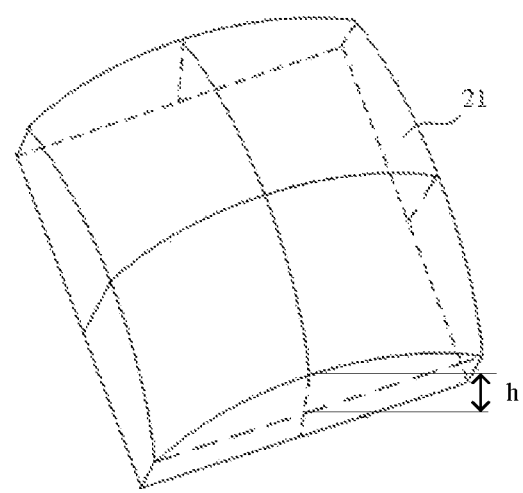
FIG. 8 is a perspective view of a lens, in accordance with embodiments of the present disclosure.

In a case where the structures in the display panel satisfy the above limiting conditions, a distance between optical centers of any two adjacent convex lenses is in a range from 0.1 mm to 10 mm, inclusive, and a height by which each lens arches is in a range from 0.1 mm to 0.5 mm, inclusive. That is, values of the first lens distance L1 and the second lens distance L2 are both within the above numerical range. Referring to FIG. 8, the height h by which the convex lens 21 arches is a maximum vertical distance between an arched surface of the convex lens and the plane where the optical center O of the convex lens is located. In a case where the distance between the optical centers of the convex lenses 21 and the height h by which the convex lens 21 arches are respectively within the above numerical ranges, a good display effect may be achieved, and difficulties in fabricating the convex lenses with the shape limited by the above ranges and the display module having the pixel units with corresponding distances are relatively small, which may facilitate the cost optimization.

For example, an orthogonal projection of each convex lens on the display module has a rectangular shape, a triangular shape or a polygonal shape. For example, referring to FIG. 8, in the case where the first pixel unit distance D1 and the second pixel unit distance D2 are equal, the first lens distance L1 and the second lens distance L2 are equal accordingly. In this case, the orthogonal projection of each convex lens 21 on the display module 1 has a square shape. For another example, in the case where the first pixel unit distance D1 and the second pixel unit distance D2 are unequal, the first lens distance L1 and the second lens distance L2 are unequal accordingly. In this case, the orthogonal projection of each convex lens 21 on the display module 1 has a rectangular shape. The shape of the orthogonal projection of the convex lens 21 on the display module 1 is related to relative magnitudes of the first pixel unit distance D1 and the second pixel unit distance D2, and is also an optimized design for the related structure of the display panel in the embodiments of the present disclosure, and may also produce the above beneficial effects.

Figure 9:
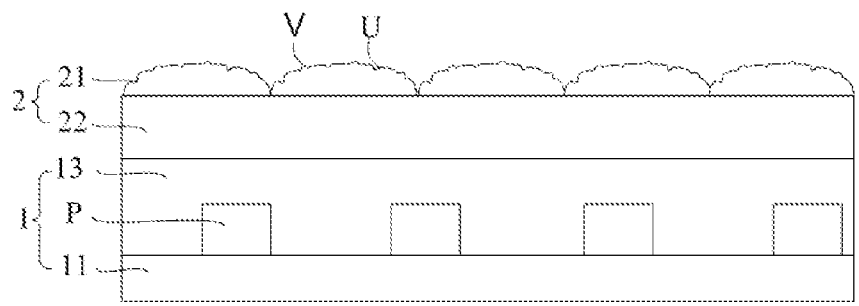
FIG. 9 is a structural diagram of a surface of a lens layer away from a display module, in accordance with embodiments of the present disclosure.

For example, the surface of the lens layer away from the display module is a rough surface. Based on the above structure, in some other embodiments, as shown in FIG. 9, the surface of the lens layer 2 away from the display module 1 (i.e., an arched surface of the lens layer) is provided with grooves U and/or protrusions V. The description will be given by considering an example in which the surface of the lens layer 2 away from the display module 1 is provided with grooves U and protrusions V. Through the above arrangement, the lens layer 2 may not only refract the light and produce the display image with smaller distances between adjacent pixels to improve the fineness of the display image, but also scatter the emitted light to make the emitted light more dispersed. As a result, the display image may be soft, and surface reflection may be reduced, and visual effect of the display apparatus may be improved.

In some embodiments, as shown in FIG. 9, the lens layer 2 further includes a transparent substrate 22 in direct contact with the surfaces of the plurality of convex lenses proximate to the display module 1. A material of the transparent substrate 22 may be same as or different from a material of the plurality of convex lenses 21, which is not limited here.

For example, the material of the transparent substrate 22 is different from the material of the plurality of convex lenses 21. In this way, in a case where the shape of the plurality of lenses (e.g., the convex lenses 21) in the lens layer 2 is determined, one of materials with different refractive indexes may be selected to form the transparent substrate 22, so as to refract the light emitted by the pixel units P. In addition, the distances between the light-exit surfaces of the pixel units P and the lens layer 2 may be adjusted by using the transparent substrate 22, which may facilitate formation of the reduced real image through the lens layer 2 to a certain extent. The material of the transparent substrate 22 may be glass, polycarbonate (PC), acrylic, or the like. The material of the convex lenses 21 may be an optically clear adhesive (OCA), the UV ray curing adhesive, or the like.

For another example, the material of the transparent base 22 is the same as the material of the plurality of convex lenses 21, and the transparent substrate 22 and the convex lenses 21 are of an integrally formed structure, so that manufacturing processes may be simplified, and the manufacturing cost may be effectively controlled.

In some embodiments, referring to FIG. 9, the display module 1 may further include a transparent material layer 13 covering the plurality of pixel units P. A distance between a surface of the transparent material layer 13 away from the plurality of light-emitting devices 12 and the substrate 11 is greater than distances between the light-exit surfaces of the plurality of light-emitting devices 12 and the substrate 11. That is, the surface of the transparent material layer 13 away from the plurality of pixel units P is higher than light-exit surfaces of the plurality of light-emitting devices 12. In this way, in addition to adjusting the distances between the light-exit surfaces of the pixel units P and the lens layer 2, it is also possible to protect the light-emitting devices 12 and the driving circuits provided at spaced positions between the light-emitting devices 12, and in turn facilitate to improve a service life of the display apparatus.

A material of the transparent material layer 13 may be the UV ray curing adhesive. Moreover, the transparent material layer 13 may be made of a black light-shielding paint with a certain transmittance, so that it is possible to prevent light reflected by reflective structures such as metal wires in the driving circuits from interfering with displayed content, and it is possible to avoid reflection interference caused by external light irradiating on the reflective structures.

It will be noted that, the above only shows a case where the lenses in the lens layer are all plano-convex lenses. It can be understood by a person skilled in the art that in practical applications, the above lenses may be biconvex lenses, concave-convex lenses, plano-concave lenses, biconcave lenses or the like. It will be noted that, in a case where the lenses are non-plano-convex lenses, the above limiting conditions need to be adjusted adaptively according to the selected lenses, so that the lens layer provided with the selected lenses may achieve the above effects.

In addition, the above only shows a case where arrangement of the lenses is the continuous arrangement in the array shown in FIG. 5 and the orthogonal projection of the lens on the display module has a square shape. The specific arrangement of the lenses and a shape of a bottom face (i.e., a surface of the lens parallel to the plane where the optical center of the lens is located and in contact with another layer) of the lens may be reasonably set according to the arrangement of the pixel units, so as to make the distance between optical centers of any two adjacent lenses in a certain arrangement direction and the distance between any two adjacent pixel units in the arrangement direction both meet the above limiting conditions.

The specific structure of the display panel provided by the embodiments of the present disclosure has been described above. Then a method for manufacturing (implementation of) the display panel will be exemplarily described.

Figure 10:
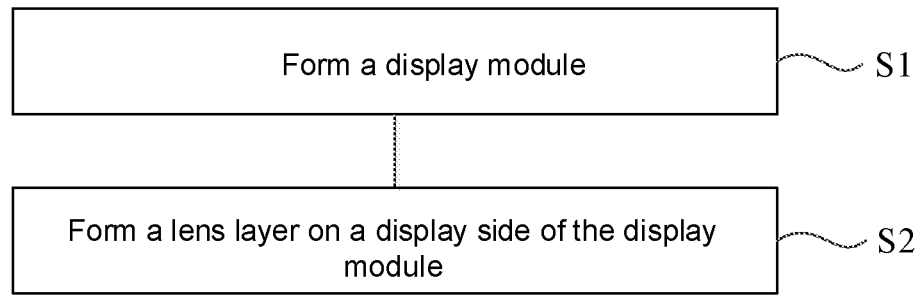
FIG. 10 is a flow diagram of a method for manufacturing a display panel, in accordance with embodiments of the present disclosure.

As shown in FIG. 10, some other embodiments of the present disclosure provide a method for manufacturing a display panel. The manufacturing method includes the following steps S1 and S2.

In S1, a display module 1 is formed.

For example, the display module 1 has a display region and a plurality of pixel units P disposed in the display region and distributed in an array, and each pixel unit P is configured to emit light.

Figure 11:
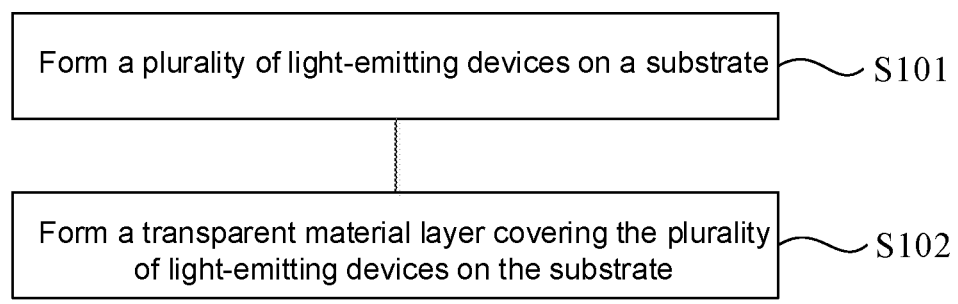
FIG. 11 is a flow diagram of a method for manufacturing a display module, in accordance with embodiments of the present disclosure.

Referring to FIG. 11, forming the display module may include the following steps S101 and S102.

In S101, plurality of light-emitting devices 12 are formed on a substrate 11.

Figure 12:
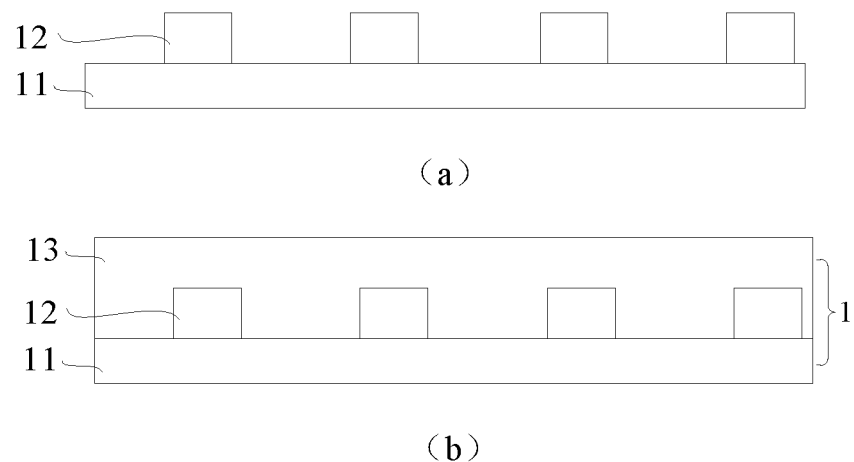
FIG. 12 is a flow diagram of another method for manufacturing a display module, in accordance with embodiments of the present disclosure.

For example, referring to (a) of FIG. 12, the plurality of light-emitting devices 12 may be formed on the substrate 11 by means of bonding. In order to facilitate wiring, there is a distance between any two adjacent light-emitting devices.

In S102, a transparent material layer 13 covering the plurality of light-emitting devices 12 is formed on the substrate 11.

Referring to (b) of FIG. 12, a distance between a surface of the transparent material layer 13 away from the plurality of light-emitting devices 12 and the substrate 11 is greater than distances between the light-exit surfaces of the plurality of light-emitting devices 12 and the substrate 11. The transparent material layer 13 completely covers the plurality of light-emitting devices 12, and fills gaps between the plurality of light-emitting devices 12, so as to protect the light-emitting devices 12 and driving circuits provided between the light-emitting devices 12.

For example, the transparent material layer 13 may be made of a black light-shielding paint with a certain transmittance, so that it is possible to prevent light reflected by reflective structures such as metal wires in the driving circuits from interfering with displayed content, and it is possible to avoid reflection interference caused by external light irradiating on the reflective structures. During formation, the substrate 11 may be coated with the black light-shielding paint by spin coating.

In S2, a lens layer 2 is formed on a display side of the display module 1.

For example, the lens layer 2 may be directly formed on the transparent material layer 13 of the display module 1; alternatively, the lens layer 2 may be formed separately, and then is adhered to the transparent material layer 13 of the display module 1 by adhesion.

Figure 13:
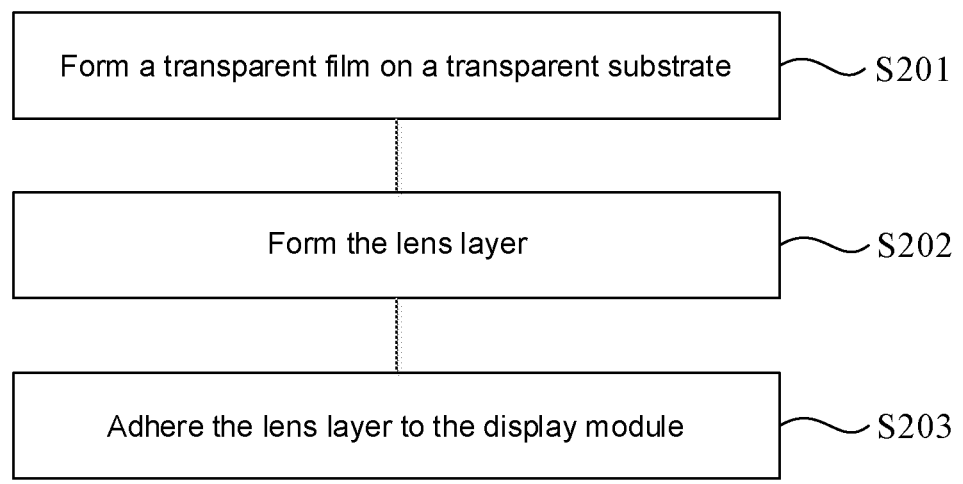
FIG. 13 is a flow diagram of forming a lens layer on a display side of a display module, in accordance with embodiments of the present disclosure.

Referring to FIG. 13, in a case where the lens layer 2 is not directly formed on the display module 1, forming the lens layer 2 on the display side of the display module 1 may include the following steps S201 to S203.

In S201, a transparent film 20 is formed on a transparent substrate 22.

Figure 14:
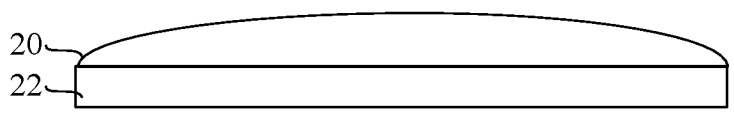
FIG. 14 is a flow diagram of another method for manufacturing a display panel, in accordance with embodiments of the present disclosure.
Figure 14:
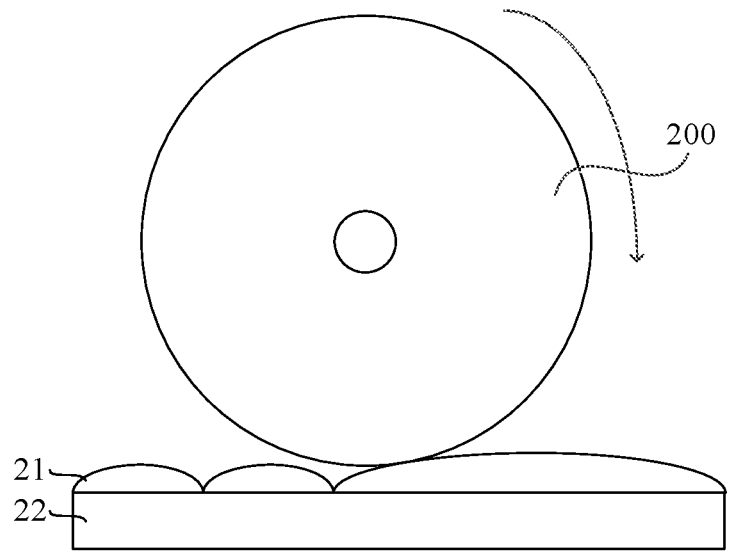
Figure 14:
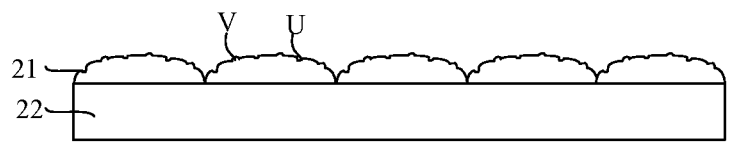
Figure 14:
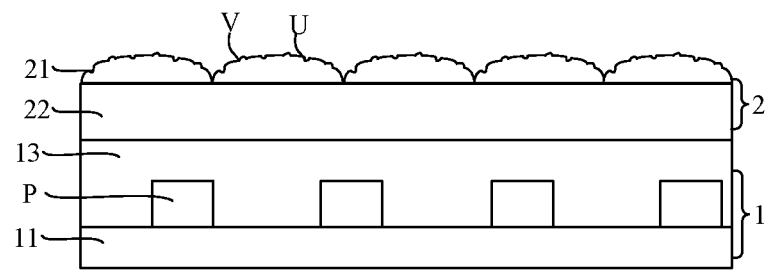

For example, referring to (a) of FIG. 14, the transparent film 20 may be formed on the transparent substrate 22 by coating.

In S202, the lens layer 2 is formed.

For example, the transparent film 20 may be imprinted by a mold imprinting process to form the lens layer 2.

Referring to (b) of FIG. 14, considering an example in which lenses are plano-convex lenses, during formation, shapes of the plano-convex lenses may be formed on a surface of a flat metal mold, and then the shapes of the plano-convex lenses are transferred onto a roller mold 200 to form a large-area imprint mold on the roller mold 200, and finally the plano-convex lenses are formed on the transparent film 20 by roll coating. The shapes of the plano-convex lenses may be engraved on the surface of the metal mold by using an ultra-high-precision cutting tool.

In S203, the lens layer 2 is adhered to the display module.

For example, referring to (d) of FIG. 14, the transparent substrate 22 of the lens layer 2 may be adhered to the display module 1 by adhesion, so as to form the display panel. Moreover, in order to avoid air bubbles at adhesion positions, the operation may be performed in a vacuum environment, pressure in which may be 0.3 atm.

For example, referring to (c) of FIG. 14, before adhering the transparent substrate 22 of the lens layer 2 to the display module 1 by adhesion, the method for manufacturing the display panel may further includes treating a surface of the lens layer 2 away from the display module to be a rough surface, i.e., performing a haze treatment on the surface of the lens layer 2 away from the display module 1. For example, grooves U and protrusions V may be provided in/on the surface of the lens layer away from the display module. During fabrication, surface treatment may be performed on the metal mold in which the shapes of the plano-convex lenses have been formed, so as to form shapes of the grooves U and the protrusions V in/on the surface of the metal mold; then, the shapes on the metal mold are transferred onto the roller mold to form a large-area imprint mold on the roller mold, so that a surface of a mold core of the mold used in the mold imprinting process is a rough surface; finally, the lens layer 2 with a rough surface is formed by roll coating.

Beneficial effects of the method for manufacturing the display panel provided by the embodiments of the present disclosure are same as those of the display panel provided by the embodiments of the present disclosure, and details will not be repeated here.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
   a display module having a display region, the display module including a plurality of pixel units disposed in the display region and distributed in an array, each pixel unit being configured to emit light;
   a lens layer disposed on a display side of the display module; wherein
   light emitted by the plurality of pixel units passes through the lens layer to form a display image, and the display image includes a plurality of pixels distributed in another array;
   a number of pixel units included in a line of pixel units in a first direction is less than a number of pixels included in a line of pixels in the first direction; a first pixel distance is less than a first pixel unit distance, the first pixel distance is a distance between every two adjacent pixels in the first direction, and the first pixel unit distance is a distance between every two adjacent pixel units in the first direction; the first direction is one of a row direction and a column direction of the plurality of pixel units that are distributed in the array.

2. The display panel according to claim 1, wherein
   a number of pixel units included in a line of pixel units in a second direction is less than a number of pixels included in the line of pixels in the second direction; a second pixel distance is less than a second pixel unit distance, the second pixel distance is a distance between every two adjacent pixels in the second direction, and the second pixel unit distance is a distance between every two adjacent pixel units in the second direction;
   the second direction is perpendicular to the first direction.

3. The display panel according to claim 1, wherein
   a size of the display region is substantially equal to a size of the display image.

4. The display panel according to claim 1, wherein
   the lens layer includes a plurality of convex lenses distributed in an array, and optical centers of the plurality of convex lenses are in a same plane; a focal length f of each convex lens and T satisfy a following condition: T is greater than a product of 2 and f (T>2×f), wherein T is a set distance, and the set distance is a vertical distance between a light-exit surface of each pixel unit and the plane where the optical centers of the plurality of convex lenses are located.

5. The display panel according to claim 4, wherein
   any two adjacent convex lenses are in contact with each other.

6. The display panel according to claim 4, wherein
   each convex lens is arched in a direction of the convex lens away from the display module.

7. The display panel according to claim 4, wherein
   T is greater than or equal to C, and is less than or equal to a product of 4 and C (C≤T≤4×C), wherein C is a reference distance, the reference distance is a greater one of the first pixel unit distance and a second pixel unit distance; the second pixel unit distance is a distance between every two adjacent pixel units in a second direction, and the second direction is perpendicular to the first direction.

8. The display panel according to claim 4, wherein
   L1 is greater than or equal to a product of 0.7 and D1, and is less than or equal to a product of 2 and D1

($0.7D1 \leq L1 \leq 2 \times D1$), wherein D1 is the first pixel unit distance, and L1 is a first lens distance; the first lens distance is a distance between optical centers of two adjacent convex lenses in the lens layer in the first direction.

9. The display panel according to claim 4, wherein L2 is greater than or equal to a product of 0.7 and D2, and is less than or equal to a product of 2 and D2 ($0.7 \times D2 \leq L2 \leq 2 \times D2$), wherein D2 is a second pixel unit distance, and L2 is a second lens distance; the second lens distance is a distance between optical centers of two adjacent convex lenses in the lens layer in a second direction, the second pixel unit distance is a distance between every two adjacent pixel units in the second direction, and the second direction is perpendicular to the first direction.

10. The display panel according to claim 4, wherein a distance between optical centers of every two adjacent convex lenses is in a range from 0.1 mm to 10 mm, inclusive, and a height by which each convex lens arches is in a range from 0.1 mm to 0.5 mm, inclusive.

11. The display panel according to claim 4, wherein an orthogonal projection of each convex lens on the display module has a rectangular shape, a triangular shape or a polygonal shape.

12. The display panel according to claim 1, wherein a surface of the lens layer away from the display side of the display module is a rough surface.

13. The display panel according to claim 4, wherein the lens layer further includes a transparent substrate in direct contact with surfaces of the plurality of convex lenses proximate to the display module.

14. The display panel according to claim 13, wherein a material of the transparent substrate is different from a material of the convex lenses.

15. The display panel according to claim 1, wherein each pixel unit includes at least one light-emitting device; the display module further includes a substrate, and light-emitting devices in the plurality of pixel units are disposed on the substrate;
the display module further includes a transparent material layer covering the light-emitting devices, and a distance between a surface of the transparent material layer away from the light-emitting devices and the substrate is greater than distances between light-exit surfaces of the light-emitting devices and the substrate.

16. The display panel according to claim 15, wherein the light-emitting device is a light-emitting diode.

17. A display apparatus, comprising the display panel according to claim 1.

18. A method for manufacturing a display panel, the method comprising:
forming a display module, wherein the display module has a display region, and the display module includes a plurality of pixel units disposed in the display region and distributed in an array; each pixel unit is configured to emit light; and
forming a lens layer on a display side of the display module; wherein
light emitted by the plurality of pixel units passes through the lens layer to form a display image, and the display image includes a plurality of pixels distributed in another array;
a number of pixel units included in a line of pixel units in a first direction is less than a number of pixels included in a line of pixels in the first direction, a first pixel distance is less than a first pixel unit distance, the first pixel distance is a distance between every two adjacent pixels in the first direction, and the first pixel unit distance is a distance between every two adjacent pixel units in the first direction; the first direction is one of a row direction and a column direction of the plurality of pixel units distributed in the array.

19. The method for manufacturing the display panel according to claim 18, wherein forming the display module includes:
forming a plurality of light-emitting devices on a substrate; and
forming a transparent material layer covering the plurality of light-emitting devices on the substrate; wherein
a distance between a surface of the transparent material layer away from the plurality of light-emitting devices and the substrate is greater than distances between light-exit surfaces of the plurality of light-emitting devices and the substrate.

20. The method for manufacturing the display panel according to claim 18, wherein forming the lens layer on the display side of the display module includes:
forming a transparent film on a transparent substrate;
imprinting the transparent film by a mold imprinting process to form the lens layer; and
adhering the lens layer to the display module; wherein
a surface of a mold core of a mold used in the mold imprinting process is a rough surface.

* * * * *